United States Patent
Rouh et al.

(10) Patent No.: US 7,332,772 B2
(45) Date of Patent: Feb. 19, 2008

(54) SEMICONDUCTOR DEVICE HAVING A RECESSED GATE AND ASYMMETRIC DOPANT REGIONS AND METHOD OF MANUFACTURING THE SAME

(75) Inventors: Kyoung Bong Rouh, Gyunggi-do (KR); Seung Woo Seung, Gyunggi-do (KR); Min Yong Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 176 days.

(21) Appl. No.: 11/292,381

(22) Filed: Nov. 29, 2005

(65) Prior Publication Data

US 2007/0004151 A1    Jan. 4, 2007

(30) Foreign Application Priority Data

Jun. 29, 2005    (KR) .................. 10-2005-0057362

(51) Int. Cl.
*H01L 29/76* (2006.01)
(52) U.S. Cl. .................. 257/330; 257/288; 257/520; 257/622; 257/E29.268; 257/E29.201
(58) Field of Classification Search ................ 257/330, 257/520, E29.268, E29.201, 622, 283–284

See application file for complete search history.

(56) References Cited

U.S. PATENT DOCUMENTS

| | | | |
|---|---|---|---|
| 4,616,400 A | | 10/1986 | Macksey et al. |
| 4,660,068 A | * | 4/1987 | Sakuma et al. ............. 257/506 |
| 5,270,228 A | | 12/1993 | Ishikawa |
| 5,362,677 A | | 11/1994 | Sakamoto et al. |
| 5,834,810 A | | 11/1998 | Schunke et al. |
| 6,815,714 B1 | * | 11/2004 | Coppock et al. ............. 257/48 |
| 6,933,556 B2 | | 8/2005 | Endoh et al. |

FOREIGN PATENT DOCUMENTS

| | | | |
|---|---|---|---|
| JP | 53113481 A | * | 10/1978 |
| KR | 0161733 | | 2/1999 |

* cited by examiner

*Primary Examiner*—Kenneth Parker
*Assistant Examiner*—José R. Díaz
(74) *Attorney, Agent, or Firm*—Townsend and Townsend and Crew LLP

(57) ABSTRACT

A semiconductor device, having a recessed gate and asymmetric dopant regions, comprises a semiconductor substrate having a trench with a first sidewall and a second sidewall, the heights of which are different from each other, a gate insulating layer pattern disposed on the semiconductor substrate, a gate stack disposed on the semiconductor such that the gate stack protrudes from the surface of the semiconductor substrate while the gate stack fills the trench, and first and second dopant regions disposed at the upper part of the semiconductor substrate adjacent to the first and second sidewalls of the trench, respectively, such that the first and second dopant regions have different steps.

8 Claims, 10 Drawing Sheets

SEMICONDUCTOR DEVICE HAVING A RECESSED GATE AND ASYMMETRIC DOPANT REGIONS AND METHOD OF MANUFACTURING THE SAME

BACKGROUND OF THE INVENTION

1. Field of the Invention

The present invention relates to a semiconductor device and a method of manufacturing the same, and, more particularly, to a semiconductor device having a recessed gate and asymmetric dopant regions and a method of manufacturing the same.

2. Description of the Related Art

Recently, integration of semiconductor devices has rapidly increased, and therefore, the channel length of transistors constituting each of the semiconductor devices has been sharply reduced. The short channel effect due to the decrease of the channel length causes several problems, by which the operational characteristics of the semiconductor device are deteriorated. For example, the strength of the electric field in the vicinity of the drain region is increased as the channel length is reduced. A hot carrier effect is generated by the increased strength of the electric field, and as a result, the operational characteristics and the stability of the semiconductor device are deteriorated. For a semiconductor memory device, such as a dynamic random access memory (DRAM), on the other hand, leakage current is generated as the strength of the electric field at the cell regions is increased, and the leakage current deteriorates the refresh characteristics of the semiconductor device.

In order to control the short channel effect, there have been recently proposed technologies to increase the effect channel length without reducing integration of the semiconductor device. For example, a recess cell structure and a step-gate asymmetric recess structure have been proposed. For the recess cell structure, a trench is formed at a substrate, and then the trench is filled with a gate conduction layer to form a gate stack. In the recess cell structure, the channel is formed around the trench, and therefore, the effective channel length is increased. For the step-gate asymmetric recess structure, on the other hand, a stepped profile is formed at the substrate, and a gate stack is formed at the stepped profile such that opposite side parts of the gate stack are disposed in an asymmetric fashion. In the step-gate asymmetric recess structure, the channel is formed along the stepped profile, and therefore, the effective channel length is increased.

In the recess cell structure and the step-gate asymmetric recess structure, the effective channel length is increased while the integration is not reduced, and therefore, the short channel effect is controlled. However, the amount of drain current is reduced due to the increase of the effective channel length with the result that the operational speed of the semiconductor device is reduced. This phenomenon is detrimental to semiconductor devices, such as graphic DRAM's, which are operated at high speed.

SUMMARY OF THE INVENTION

Therefore, the present invention has been made in view of the above problems, and it is an object of the present invention to provide a semiconductor device having a recessed gate and asymmetric dopant regions wherein the operation speed of the semiconductor device is increased, while a short channel effect is controlled, such that the semiconductor device is suitable for applications requiring high-speed operation.

It is another object of the present invention to provide a method of manufacturing such a semiconductor device having a recessed gate and asymmetric dopant regions.

In accordance with one aspect of the present invention, the above and other objects can be accomplished by the provision of a semiconductor device having a recessed gate and asymmetric dopant regions, comprising: a semiconductor substrate having a trench with a first sidewall and a second sidewall, the heights of which are different from each other; a gate insulating layer pattern disposed on the semiconductor substrate; a gate stack disposed on the semiconductor such that the gate stack is protruded from the surface of the semiconductor substrate while the gate stack fills the trench; and first and second dopant regions disposed at the upper part of the semiconductor substrate adjacent to the first and second sidewalls of the trench, respectively, such that the first and second dopant regions have different steps.

Preferably, the gate stack comprises a gate conduction layer pattern and a gate metal layer pattern, which are stacked in consecutive order.

Preferably, the gate stack extends to the upper surface of the semiconductor substrate adjacent to the first and second sidewalls of the trench such that the gate stack partially overlaps with the first and second dopant regions.

Preferably, the first dopant region is disposed at the upper part of the semiconductor substrate adjacent to the first sidewall of the trench, and the second dopant region is disposed at the upper part of the semiconductor substrate adjacent to the second sidewall of the trench.

Preferably, the first dopant region is a source region, and the second dopant region is a drain region.

Alternatively, the first dopant region may be a drain region, and the second dopant region may be a source region.

Preferably, the first and second dopant regions have a lightly doped drain (LDD) structure.

Preferably, the semiconductor further comprises: a buffer insulation layer disposed on the exposed surface of the gate stack; and a gate spacer layer disposed at the sidewall of the buffer insulation layer.

In accordance with another aspect of the present invention, there is provided a method of manufacturing a semiconductor device having a recessed gate and asymmetric dopant regions, comprising the steps of: forming a trench at a third region of a semiconductor substrate, the third region of the semiconductor substrate being disposed between a first region and a second region of the semiconductor substrate; removing the second region of the semiconductor substrate by a predetermined thickness to form steps at the first and second regions; forming a gate insulating layer pattern and a gate stack, which fills the trench, on the semiconductor substrate exposed by the trench; and forming first and second dopant regions at the upper part of the semiconductor substrate at the first and second regions, respectively.

Preferably, the step of forming the gate insulating layer pattern and the gate stack comprises the sub-steps of:

forming a gate insulating layer, a gate conduction layer, and a gate metal layer on the upper surface of the stepped semiconductor substrate in consecutive order to fill the trench; and patterning the gate insulating layer, the gate conduction layer, and the gate metal layer to form a gate insulating layer pattern, a gate conduction layer pattern, and a gate metal layer pattern.

Preferably, the step of patterning the gate insulating layer, the gate conduction layer, and the gate metal layer is performed to extend the gate insulating layer pattern, the gate conduction layer pattern, and the gate metal layer pattern to the upper surface of the semiconductor substrate at the first and second dopant regions such that the gate insulating layer pattern, the gate conduction layer pattern, and the gate metal layer pattern partially overlap with the first and second dopant regions.

Preferably, the method further comprises the steps of: forming a buffer insulation layer on the exposed surfaces of the gate insulating layer pattern and the gate stack; and forming a gate spacer layer at the sidewall of the buffer insulation layer.

Preferably, the step of forming the first and second dopant regions comprises the sub-steps of: performing a first ion implantation, after forming the gate insulating layer pattern and the gate stack, to form first and second low-concentration dopant regions; and performing a second ion implantation, after forming the buffer insulation layer and the gate spacer layer, to form first and second high-concentration dopant regions.

In accordance with yet another aspect of the present invention, there is provided a method of manufacturing a semiconductor device having a recessed gate and asymmetric dopant regions, comprising the steps of: forming a trench at a third region of a semiconductor substrate, the third region of the semiconductor substrate being disposed between a first region and a second region of the semiconductor substrate; growing the first region of the semiconductor substrate by a predetermined thickness to form steps at the first and second regions; forming a gate insulating layer pattern and a gate stack, which fills the trench, on the semiconductor substrate exposed by the trench; and forming first and second dopant regions at the upper part of the semiconductor substrate at the first and second regions, respectively.

Preferably, the step of growing the first region of the semiconductor is performed by an epitaxial growth process.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the accompanying drawings. It should be noted, however, that the following embodiments of the present invention may take different forms, and therefore, the scope of the present invention is not limited by the following embodiments of the present invention.

Figure 1:
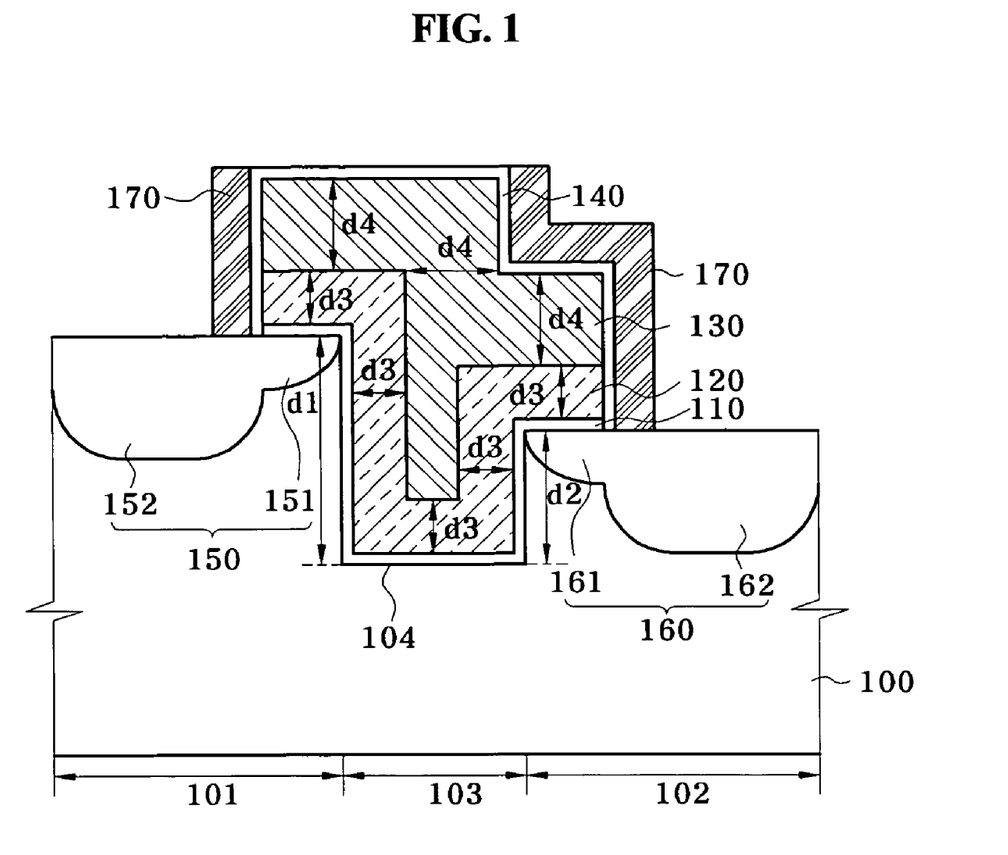
FIG. 1 is a sectional view illustrating a semiconductor device having a recessed gate and asymmetric dopant regions according to the present invention.

FIG. 1 is a sectional view illustrating a semiconductor device having a recessed gate and asymmetric dopant regions according to the present invention.

Referring to FIG. 1, a semiconductor substrate 100 has a first region 101 and a second region 102, the upper surface levels of which are different from each other. Between the first region 101 and the second region 102 is disposed a third region 103, at which a trench 104 having a predetermined depth is formed. Since the upper surface level of the semiconductor substrate 100 at the first region 101 is higher than that of semiconductor substrate 100 at the second region 102, a first sidewall depth d1 of the trench 104 adjacent to the first region 101 is greater than a second sidewall depth d2 of the trench 104 adjacent to the second region 102.

On the trench 104 of the semiconductor substrate 100 are disposed a gate insulating layer pattern 110, a gate conduction layer pattern 120, and a gate metal layer pattern 130 in consecutive order. The gate insulating layer pattern 110 may be formed of an oxide layer. The gate conduction layer pattern 120 may be formed of a doped polysilicone layer. The gate metal layer pattern 130 may be formed of a tungsten layer or a tungsten silicide layer. The trench 104 is not filled by the gate insulating layer pattern 110 and the gate conduction layer pattern 120. The trench 104 is filled by the gate metal layer pattern 130. The gate insulating layer pattern 110, the gate conduction layer pattern 120, and the gate metal layer pattern 130 are disposed such that the gate insulating layer pattern 110, the gate conduction layer pattern 120, and the gate metal layer pattern 130 extend to some of the upper surface of the first region 101 adjacent to the trench 104 and some of the upper surface of the second region 102 adjacent to the trench 104. The thickness d3 of the gate conduction layer pattern 120 is uniform, and the thickness d4 of the gate metal layer pattern 130 is also uniform.

On the exposed surfaces of the gate insulating layer pattern 110, the gate conduction layer pattern 120, and the gate metal layer pattern 130 is disposed a buffer insulation layer 140, at the sidewall of which is disposed a gate spacer layer 170. The buffer insulation layer 140 may be formed of an oxide layer, and the gate spacer layer 170 may be formed of a nitride layer.

A source region 150 is disposed at the upper surface of the first region 101 of the semiconductor substrate 100, and a drain region 160 is disposed at the upper surface of the second region 102 of the semiconductor substrate 100. Since the upper surface level of the semiconductor substrate 100 at the first region 101 is different from that of a semiconductor substrate 100 at the second region 102, the source region 150 and the drain region 160 are disposed in an asymmetric fashion. Both the source region 150 and the drain region 160, which are asymmetrically disposed as described above, have a lightly doped drain (LDD) structure. Specifically, the source region 150 includes a low-concentration source extension region 151 and a high-concentration deep source region 152. In the same manner, the drain region 160 includes a low-concentration drain extension region 161 and a high-concentration deep drain region 162. As described above, the gate insulating layer pattern 110, the gate conduction layer pattern 120, and the gate metal layer pattern 130 are disposed such that the gate insulating layer pattern 110, the gate conduction layer pattern 120, and the gate metal layer pattern 130 extend to some of the upper surface of the first region 101 adjacent to the trench 104 and some of the upper surface of the second region 102 adjacent to the trench 104. As a result, the extension parts of the gate insulating layer pattern 110, the gate conduction layer pattern 120, and the gate metal layer pattern 130 overlap with the low-concentration source extension region 151 and the low-concentration drain extension region 161 over greater areas than the high-concentration deep source region 152 and the high-concentration deep drain region 162. Consequently, a sufficient gate voltage is applied to a gate terminal, although dopant concentration is low at the low-concentration source extension region 151 and the low-concentration drain extension region 161, whereby high-speed operation of the semiconductor device is accomplished.

Now, the operation of the semiconductor device having the recessed gate and the asymmetric dopant regions with the above-stated construction will be described.

When a gate voltage, which is higher than a threshold voltage, is applied to the gate terminal, which is electrically connected to the gate conduction layer pattern 120 and the gate metal layer pattern 130, a channel, for example, an inversion layer, is formed at the semiconductor substrate 100 below the gate insulating layer pattern 110. As described above, the thickness d3 of the gate conduction layer pattern 120 and the thickness d4 of the gate metal layer pattern 130 are uniform. Consequently, the resistance value is uniform at all the regions along the path to which the gate voltage is applied. As a result, the gate voltage is uniformly transmitted at all the regions, and therefore, malfunction due to the resistance difference is prevented.

The channel formed by applying the gate voltage extends from the source region 150 to the drain regions 160 via the trench 104. Therefore, the channel has an effective channel length sufficient to control a short channel effect as compared to other planar devices, although the effective channel length is not greater than that of the recessed channel. Also, the effective channel length of the channel is less than that of the recessed channel, although the effective channel length of the channel is greater than that of the planar device. Consequently, a drain current sufficient for a high-speed operation is obtained. In other words, sufficient drain current is generated while the effective channel length sufficient to control the short channel effect is obtained, whereby the high-speed operation of the semiconductor device is accomplished.

FIGS. 2 to 8 are sectional views illustrating a method of manufacturing a semiconductor device having a recessed gate and asymmetric dopant regions according to a preferred embodiment of the present invention.

Figure 2:
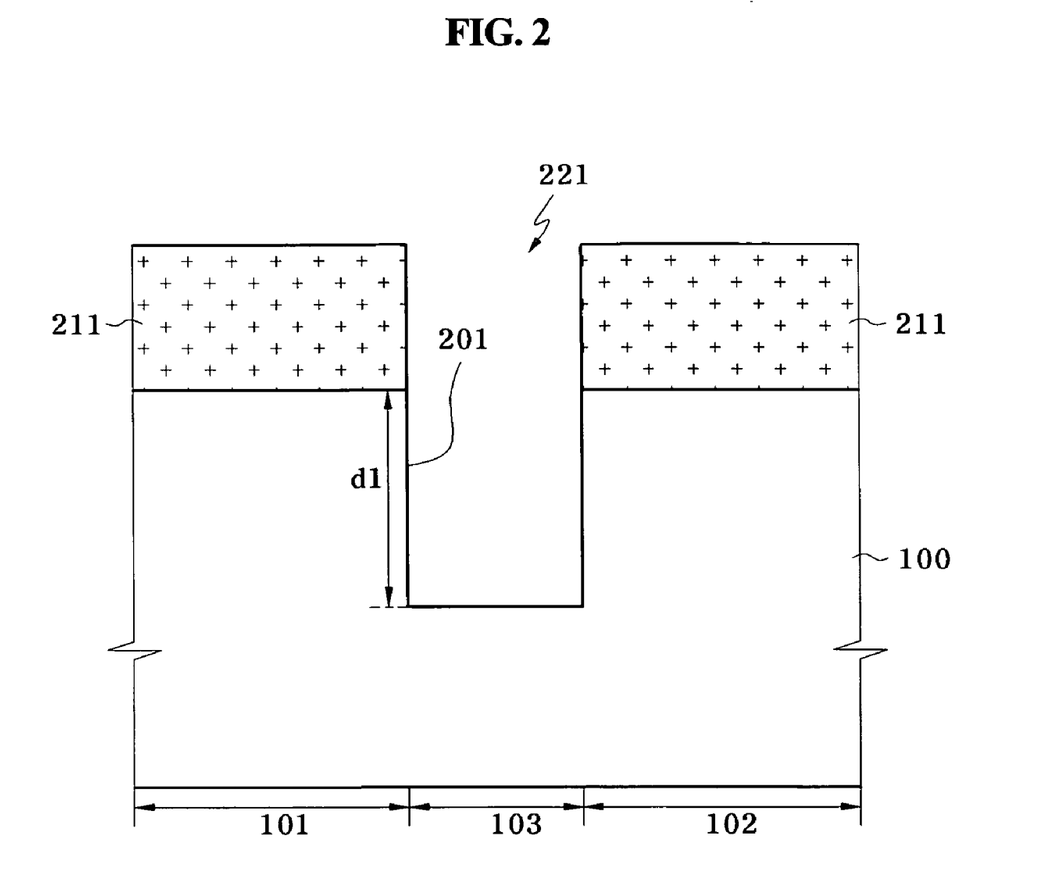
FIGS. 2 to 8 are sectional views illustrating a method of manufacturing a semiconductor device having a recessed gate and asymmetric dopant regions according to a preferred embodiment of the present invention.

Referring first to FIG. 2, a first photoresist layer pattern 211 is formed on the semiconductor substrate 100 having an active region including the first region 101, the second region 102, and the third region 102 disposed between the first region 101 and the second region 102. According to circumstances, an oxide layer pattern or a nitride layer pattern may be used instead of the first photoresist layer pattern 211. Otherwise, a mask layer pattern, which is made of another material, may be used. The first photoresist layer pattern 211 has a first opening 221, through which the upper surface of the semiconductor substrate 100 at the third region 103 is exposed. Next, an etching process is performed, while the first photoresist layer pattern 211 is used as an etching mask, to remove the semiconductor substrate 100 at the third region 103, the upper surface of which is exposed through the first opening 221, to a predetermined depth. As a result, a trench 201 having a first predetermined sidewall depth d1 is formed. The first sidewall depth d1 of the trench 201 adjacent to the first region 101 is equal to that of the trench 201 adjacent to the second region 102.

Figure 3:
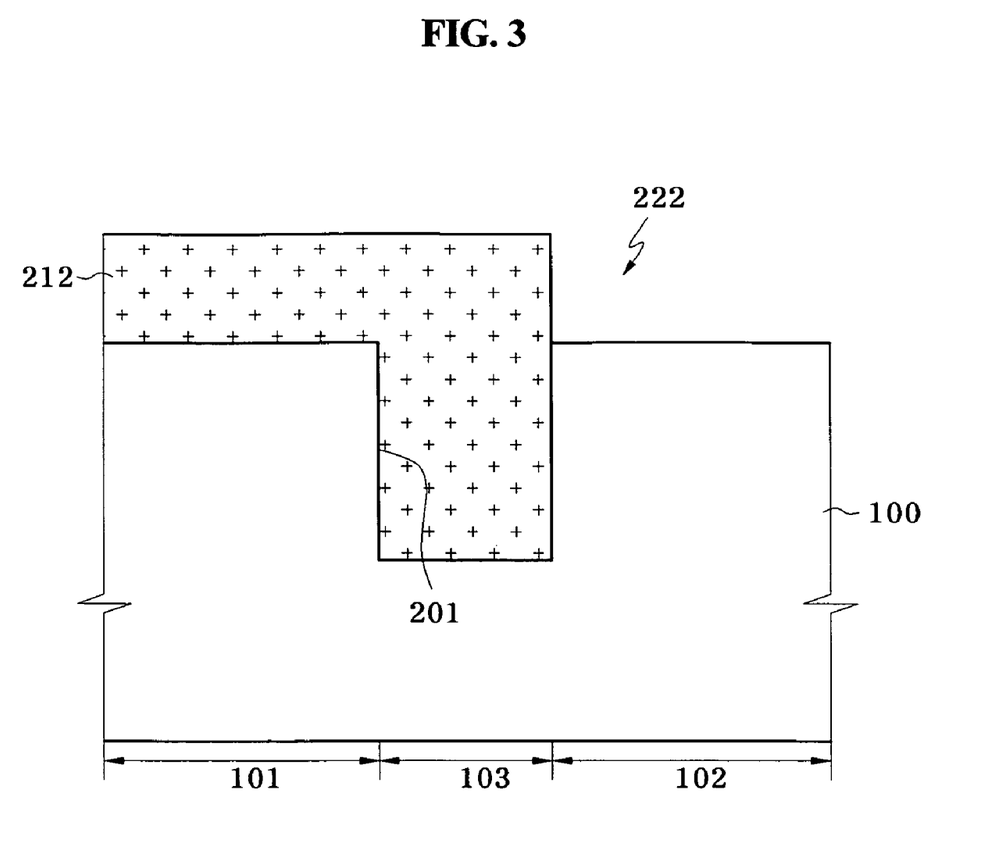

Referring now to FIG. 3, the first photoresist layer pattern 211 (see FIG. 2) is removed after the trench 201 is formed. The removal of the first photoresist layer pattern 211 may be performed by a common ashing process. After the first photoresist layer pattern 211 is removed, a cleaning process is performed on the upper surface of the semiconductor substrate 100 having the trench 210 formed therein. The cleaning process may be performed using $CFO_2$ gas or $CF_4$ gas. Furthermore, an additional process may be performed to round the corners of the trench 201 such that the trench 201 has a round profile, by which concentration of an electric field at the corners of the trench 201 is prevented. Next, a second photoresist layer pattern 212 is formed on the semiconductor substrate 100 having the trench 201. The second photoresist layer pattern 212 covers the semiconductor substrate 100 at the first region 101 and the third region 103. Also, the second photoresist layer pattern 212 has a second opening 222, through which the upper surface of the semiconductor substrate 100 at the second region 102 is exposed.

Figure 4:
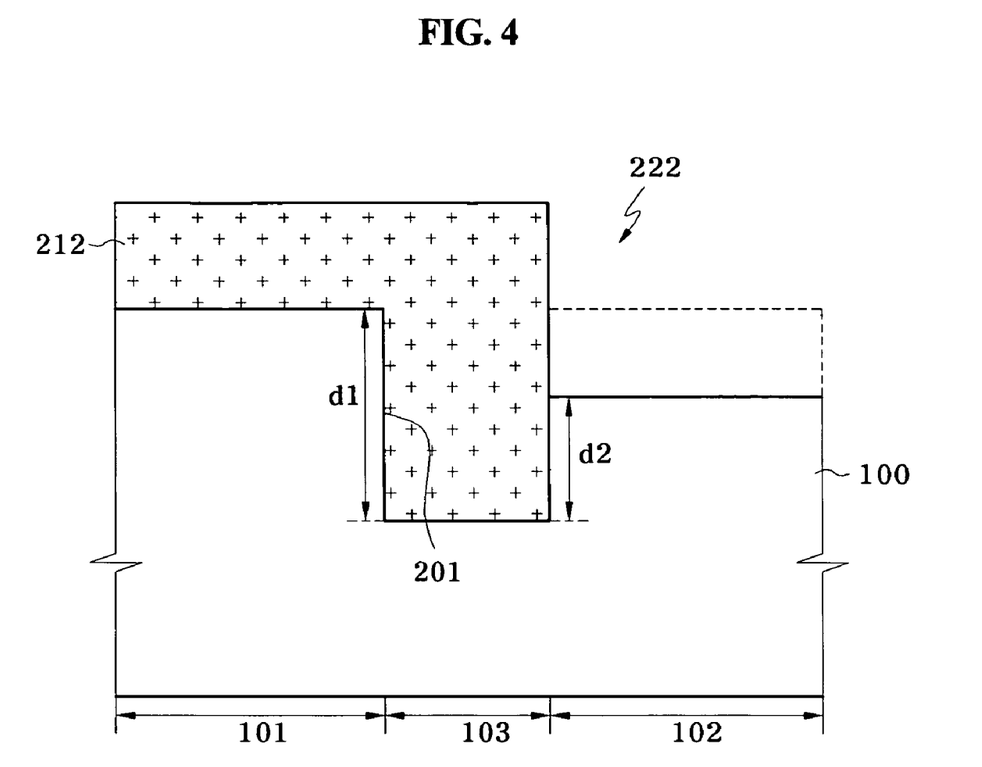

Referring now to FIG. 4, an etching process is performed, while the second photoresist layer pattern 212 is used as an etching mask, to remove the semiconductor substrate 100 at the second region 102, the upper surface of which is exposed through the second opening 222, to a predetermined depth. As a result, the trench 201 has another sidewall depth d2 adjacent to the second region 102, and therefore, the semiconductor substrate 100 is formed in an asymmetric structure in which the sidewall depth d2 of the trench 201 adjacent to the second region 102 is different from the sidewall depth d1 of the trench 201 adjacent to the first region 101.

Figure 5:
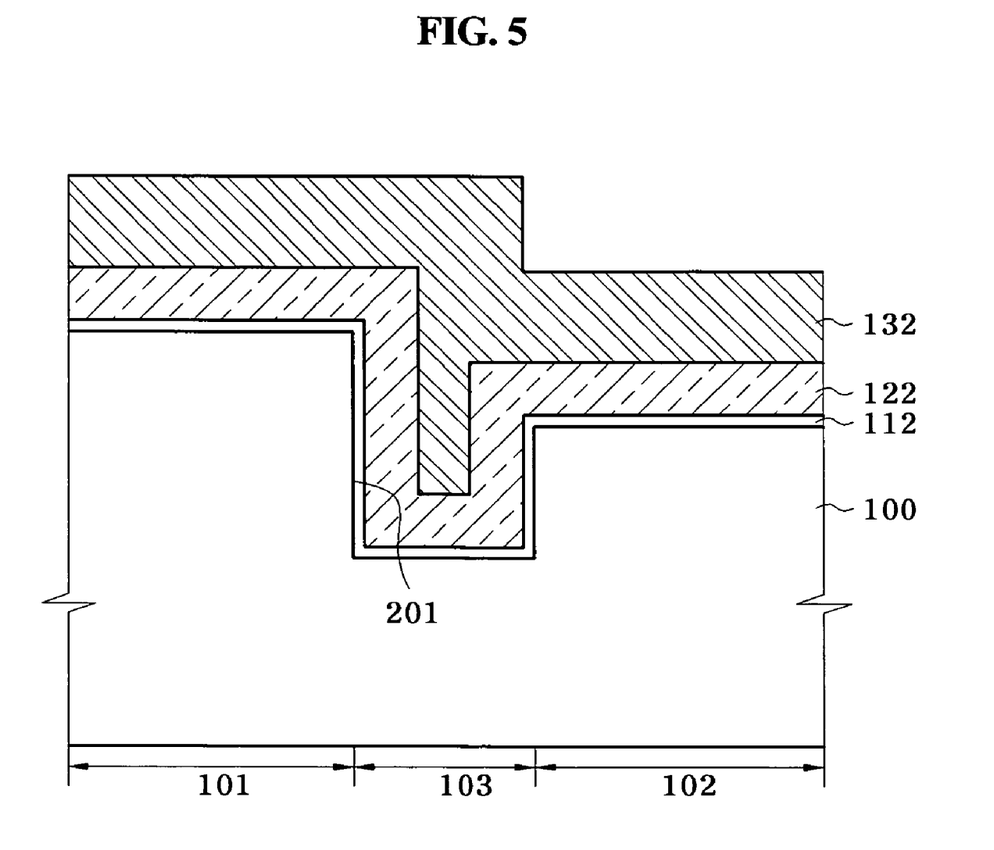

Referring now to FIG. 5, the second photoresist layer pattern 212 (see FIG. 4) is removed. Although not shown in the drawing, threshold voltage ion implantation and punchthrough stop ion implantation, common ion implanting methods, are performed. The punchthrough stop ion implantation may be performed by a tilt ion implanting method. Next, a gate insulating layer 112, a gate conduction layer 122, and a gate metal layer 132 are stacked on the upper surface of the semiconductor substrate 100 in consecutive order. The gate insulating layer 112 is formed of an oxide layer, the gate conduction layer 122 is formed of a doped polysilicone layer, and the gate metal layer 132 is formed of a tungsten layer or a tungsten silicide layer. Alternatively, the gate insulating layer 112 may be formed of a dielectric layer having a different dielectric constant, and the gate metal layer 132 may be formed of another metal layer.

Figure 6:
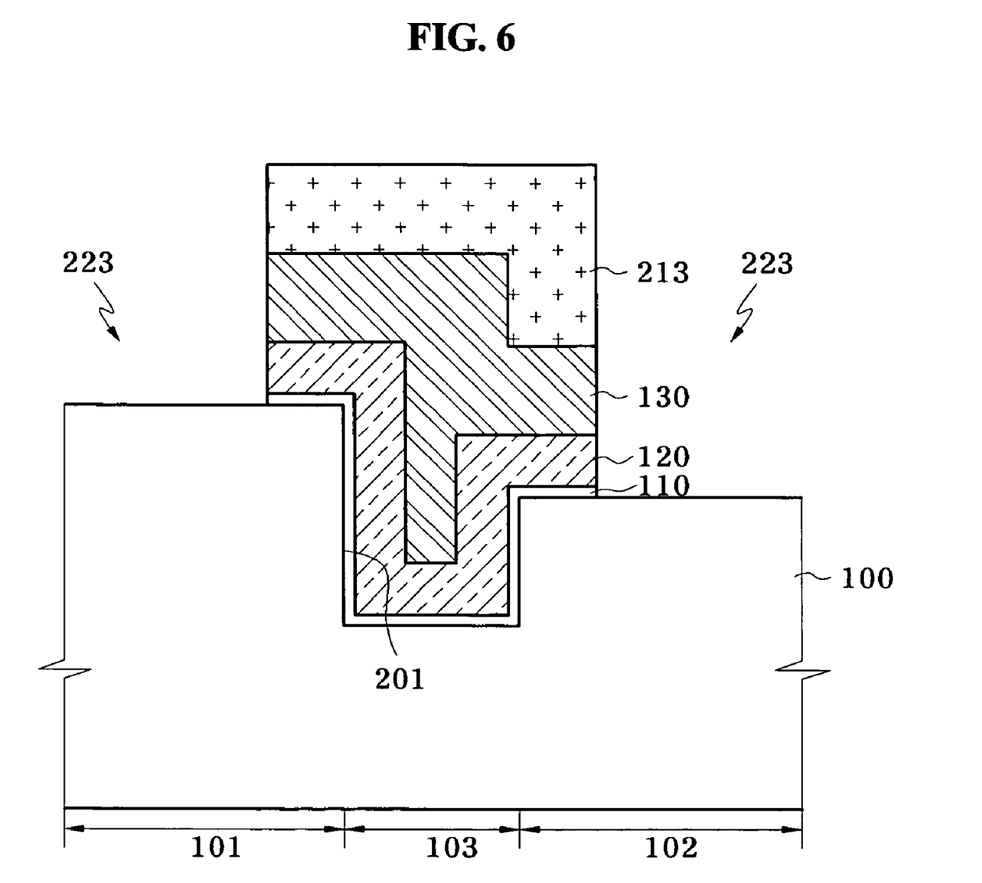

Referring now to FIG. 6, a third photoresist layer pattern 213 is formed on the gate metal layer 132 (see FIG. 5). The third photoresist layer pattern 213 has third openings 223, through which some of the upper surface of the gate metal layer 132 on the first region 101 and some of the upper surface of the gate metal layer 132 on the second region 102 are exposed. Next, an etching process is performed, while the third photoresist layer pattern 213 is used as an etching mask, to remove the exposed parts of the gate metal layer 132, the gate the gate conduction layer 122 (see FIG. 5), and the gate insulating layer 112 (see FIG. 5) in consecutive order. As a result, a gate insulating layer pattern 110, a gate conduction layer pattern 120, and a gate metal layer pattern 130, which are filled in the trench 201, are formed while the upper surface of the semiconductor substrate 100 at the first region 101 and the second region 102 is exposed. The gate conduction layer pattern 120 and a gate metal layer pattern 130, which are disposed on the gate insulating layer pattern 110 in consecutive order, constitute a gate stack, opposite ends of which overlap with the first region 101 and the second region 102.

Figure 7:
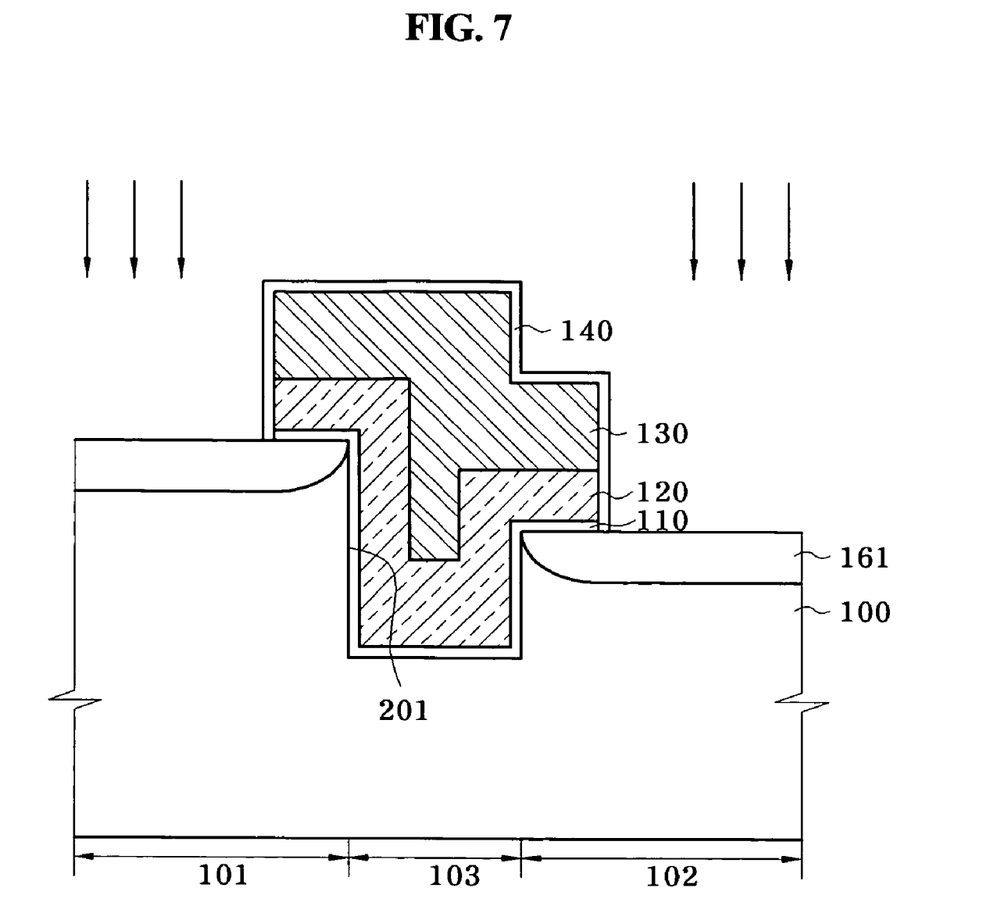

Referring now to FIG. 7, a buffer insulation layer 140 is formed on the exposed surface of the gate insulating layer pattern 110, the gate conduction layer pattern 120, and the gate metal layer pattern 130. The buffer insulation layer 140 may be formed of an oxide layer. Next, as indicated by arrows, a first ion implanting process is performed to form a source extension region 151 and a drain extension region 161 at the upper part of the semiconductor substrate 100 at the first region 101 and the second region 102, respectively. Such an ion implanting process serves to form an LDD-structured source/drain region. When another source/drain region having a different structure is required, an ion implanting process for a high-concentration source/drain region may be performed.

Figure 8:
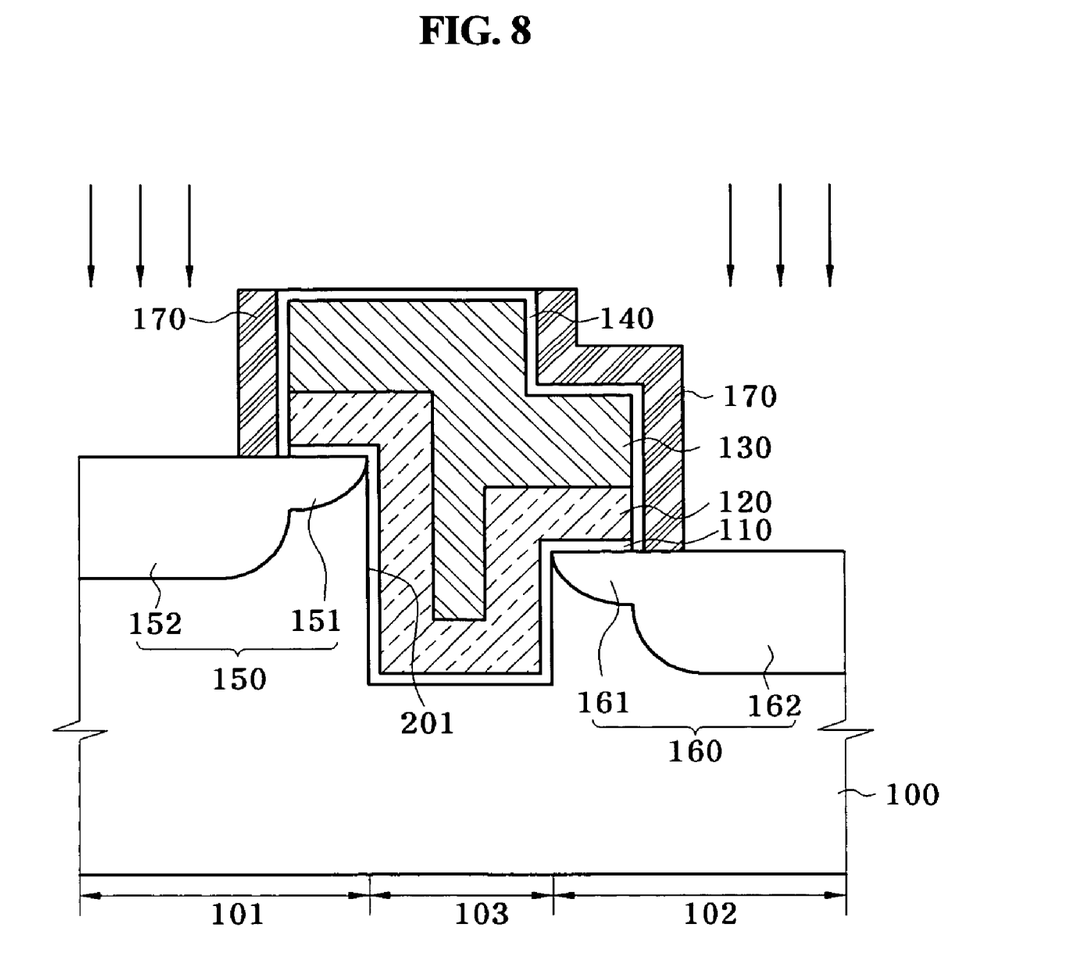

Referring now to FIG. 8, a gate spacer layer 170 is formed at the sidewall of the buffer insulation layer 140. The gate spacer layer 170 may be formed of a nitride layer. The gate spacer layer 170 may be formed by a common etchback process. Next, as indicated by arrows, a second ion implanting process is performed to form a deep source region 152 and a deep drain region 162. As a result, an LDD-structured source region 150, which comprises the source extension region 151 and the deep source region 152, and an LDD-structured drain region 160, which comprises the drain extension region 161 and the deep drain region 162, are formed.

Figure 9:
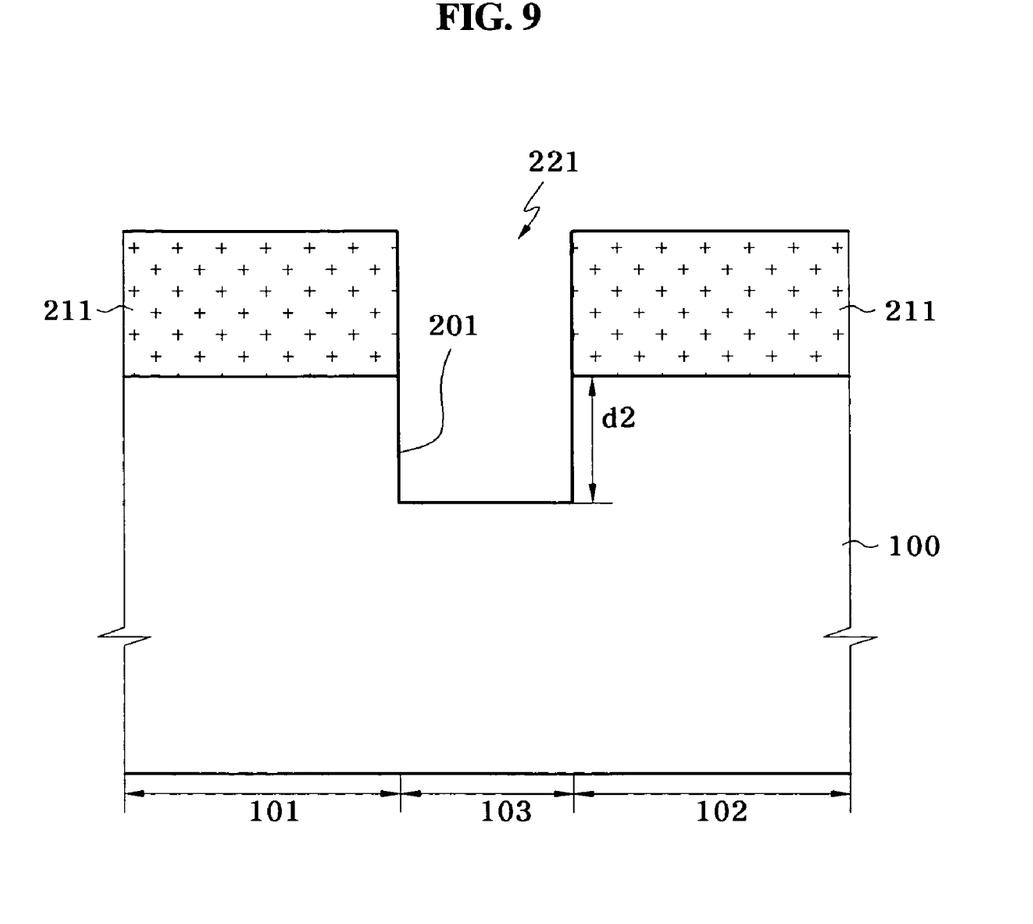
FIGS. 9 and 10 are sectional views illustrating a method of manufacturing a semiconductor device having a recessed gate and asymmetric dopant regions according to another preferred embodiment of the present invention.
Figure 10:
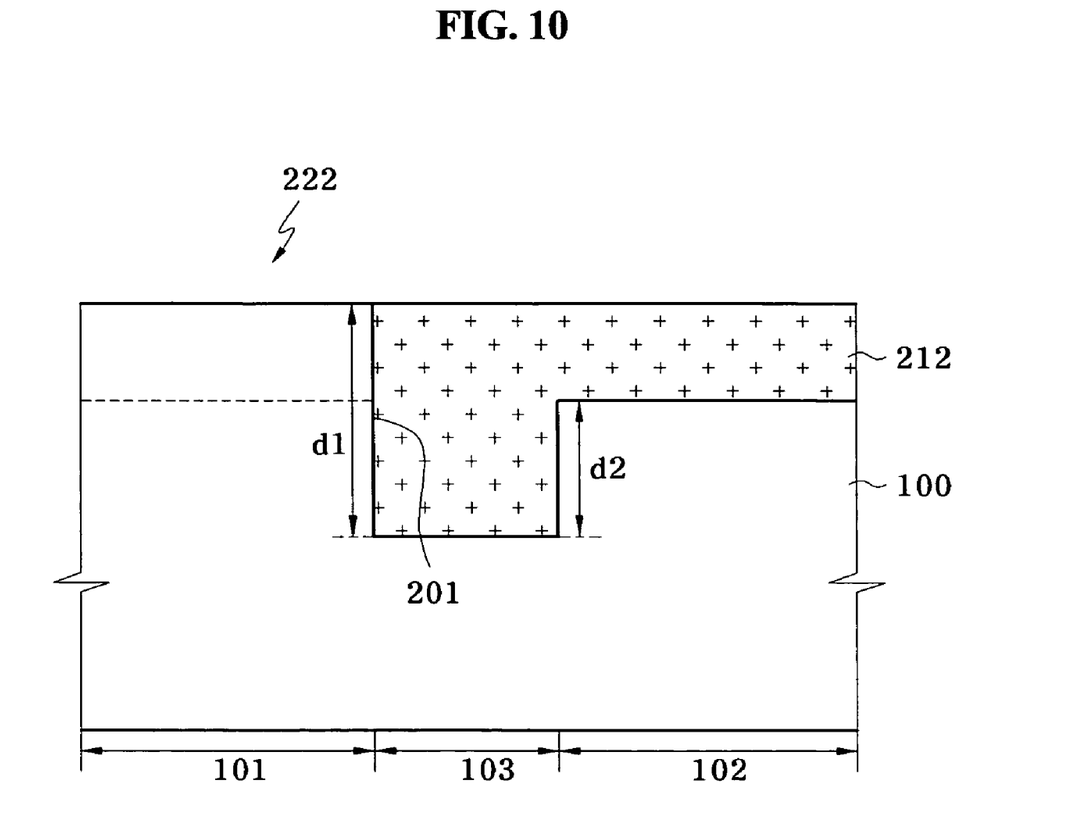

FIGS. 9 and 10 are sectional views illustrating a method of manufacturing a semiconductor device having a recessed gate and asymmetric dopant regions according to another preferred embodiment of the present invention. Elements of this embodiment shown in FIGS. 9 and 10, which are identical or similar to those of the previous embodiment shown in FIGS. 2 to 8, are denoted by the same reference numerals.

Referring first to FIG. 9, a first photoresist layer pattern 211 is formed on the semiconductor substrate 100 having an active region including the first region 101, the second region 102, and the third region 102 disposed between the first region 101 and the second region 102. The first photoresist layer pattern 211 has a first opening 221, through which the upper surface of the semiconductor substrate 100 at the third region 103 is exposed. Next, an etching process is performed, while the first photoresist layer pattern 211 is used as an etching mask, to remove the semiconductor substrate 100 at the third region 103, the upper surface of which is exposed through the first opening 221, to a predetermined depth. As a result, a trench 201 having a second predetermined sidewall depth d2 is formed such that the second sidewall depth d2 of the trench 201 adjacent to the first region 101 is equal to that of the trench 201 adjacent to the second region 102, by which this embodiment is different from the previous embodiment characterized in that the first predetermined sidewall depth d1, which is greater than the second sidewall depth d2, is formed at the trench 201.

Referring now to FIG. 10, the first photoresist layer pattern 211 (see FIG. 9) is removed after the trench 201 is formed. Next, a second photoresist layer pattern 212 is formed on the semiconductor substrate 100 having the trench 201. The second photoresist layer pattern 212 covers the semiconductor substrate 100 at the second region 102 and the third region 103. Also, the second photoresist layer pattern 212 has a second opening 222, through which the upper surface of the semiconductor substrate 100 at the first region 101 is exposed. Subsequently, the exposed semiconductor substrate 100 at the first region 101 is epitaxially grown such that the upper surface level of the semiconductor substrate 100 at the first region 101 is higher than that of the semiconductor substrate 100 at the second region 102. As a result, the semiconductor substrate 100 is formed in an asymmetric structure in which the sidewall depth d1 of the trench 201 adjacent to the first region 101 is different from the sidewall depth d2 of the trench 201 adjacent to the second region 102. After that, the second photoresist layer pattern 212 is removed, and then the several steps previously described with reference to FIGS. 5 to 8 are performed in the same manner.

As apparent from the above description, the semiconductor device having the recessed gate and the asymmetric dopant regions and the method of manufacturing the same according to the present invention have the following effects.

First, the channel length is increased by the structure of the recessed gate. Consequently, the present invention has the effect of controlling the short channel effect.

Secondly, the effective channel length is decreased by the structure of the asymmetric dopant region, and the effective channel length is less than that of the recessed channel. Consequently, the present invention has the effect of accomplishing a high-speed operation of the semiconductor device.

Thirdly, the gate stack extends to the upper surface of the semiconductor substrate adjacent to the first and second sidewalls of the trench such that the gate stack partially overlaps with the first and second dopant regions. As a result, a sufficient gate voltage is applied to the relatively low-concentration source/drain extension region. Consequently, the present invention has the effect of increasing the drain current, and therefore, increasing the operation speed of the semiconductor device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device having a recessed gate and asymmetric dopant regions, comprising:
    a semiconductor substrate having a trench with a first sidewall and a second sidewall, the heights of which are different from each other;
    a gate insulating layer pattern disposed on the semiconductor substrate;
    a gate stack disposed on the semiconductor substrate such that the gate stack is protruded from the surface of the semiconductor substrate while the gate stack fills the trench; and
    first and second dopant regions disposed at the upper part of the semiconductor substrate adjacent to the first and second sidewalls of the trench, respectively, such that the first and second dopant regions have different steps.

2. The semiconductor device as set forth in claim 1, wherein the gate stack comprises a gate conduction layer pattern and a gate metal layer pattern, which are stacked in consecutive order.

3. The semiconductor device as set forth in claim 1, wherein the gate stack extends to the upper surface of the semiconductor substrate adjacent to the first and second sidewalls of the trench such that the gate stack partially overlaps with the first and second dopant regions.

4. The semiconductor device as set forth in claim 1, wherein
the first dopant region is disposed at the upper part of the semiconductor substrate adjacent to the first sidewall of the trench, and
the second dopant region is disposed at the upper part of the semiconductor substrate adjacent to the second sidewall of the trench.

5. The semiconductor device as set forth in claim 4, wherein
the first dopant region is a source region, and
the second dopant region is a drain region.

6. The semiconductor device as set forth in claim 4, wherein
the first dopant region is a drain region, and
the second dopant region is a source region.

7. The semiconductor device as set forth in claim 1, wherein the first and second dopant regions have a lightly doped drain (LDD) structure.

8. The semiconductor device as set forth in claim 1, further comprising:
a buffer insulation layer disposed on the exposed surface of the gate stack; and
a gate spacer layer disposed at the sidewall of the buffer insulation layer.

* * * * *